United States Patent

Kuhlmann et al.

[11] Patent Number: 5,990,499
[45] Date of Patent: Nov. 23, 1999

[54] INTEGRATED SEMICONDUCTOR CIRCUIT

[75] Inventors: Werner Kuhlmann, München; Norbert Stath, Regensburg; Hans-Ludwig Althaus, Lappersdorf; Werner Späth, Holzkirchen, all of Germany

[73] Assignee: Siemens Aktiengesellschaft, Munich, Germany

[21] Appl. No.: 09/163,599

[22] Filed: Sep. 28, 1998

Related U.S. Application Data

[63] Continuation of application No. PCT/DE97/00501, Mar. 13, 1997.

[30] Foreign Application Priority Data

Mar. 28, 1996 [DE] Germany .................. 196 12 388

[51] Int. Cl.$^6$ .................................................. H01L 33/00
[52] U.S. Cl. .............................. 257/99; 257/79; 257/103
[58] Field of Search .................... 257/84, 79, 93, 257/99, 103, 173

[56] References Cited

U.S. PATENT DOCUMENTS 5,491,349 2/1996 Komoto et al. ..................... 257/88

FOREIGN PATENT DOCUMENTS 2 197 126  5/1988  United Kingdom .

OTHER PUBLICATIONS

Patent Abstracts of Japan No. 59–188181 (Mitsuhiro et al.), dated Oct. 25, 1984.
"Off–Chip Electrostatic Discharge Protection", IBM Technical Disclosure Bulletin, vol. 32, No. 6B, Nov. 1989.

*Primary Examiner*—Ngân V. Ngô
*Attorney, Agent, or Firm*—Herbert L. Lerner; Laurence A. Greenberg

[57] ABSTRACT

An integrated semiconductor circuit has a component formed of a semiconductor substrate with an active pn junction formed between a first semiconductor region of a first conductivity type and a second semiconductor region of a second conductivity type. The semiconductor circuit also has a protective circuit that is associated with the component and serves to dissipate overvoltages and/or electrostatic charges. The protective circuit has a protective pn junction formed in a semiconductor mount with a first semiconductor mount region of the first conductivity type and a second semiconductor mount region of the second conductivity type. The second semiconductor mount region of the second conductivity type is electrically coupled to the first semiconductor region formed in the semiconductor substrate of the first conductivity type.

9 Claims, 1 Drawing Sheet

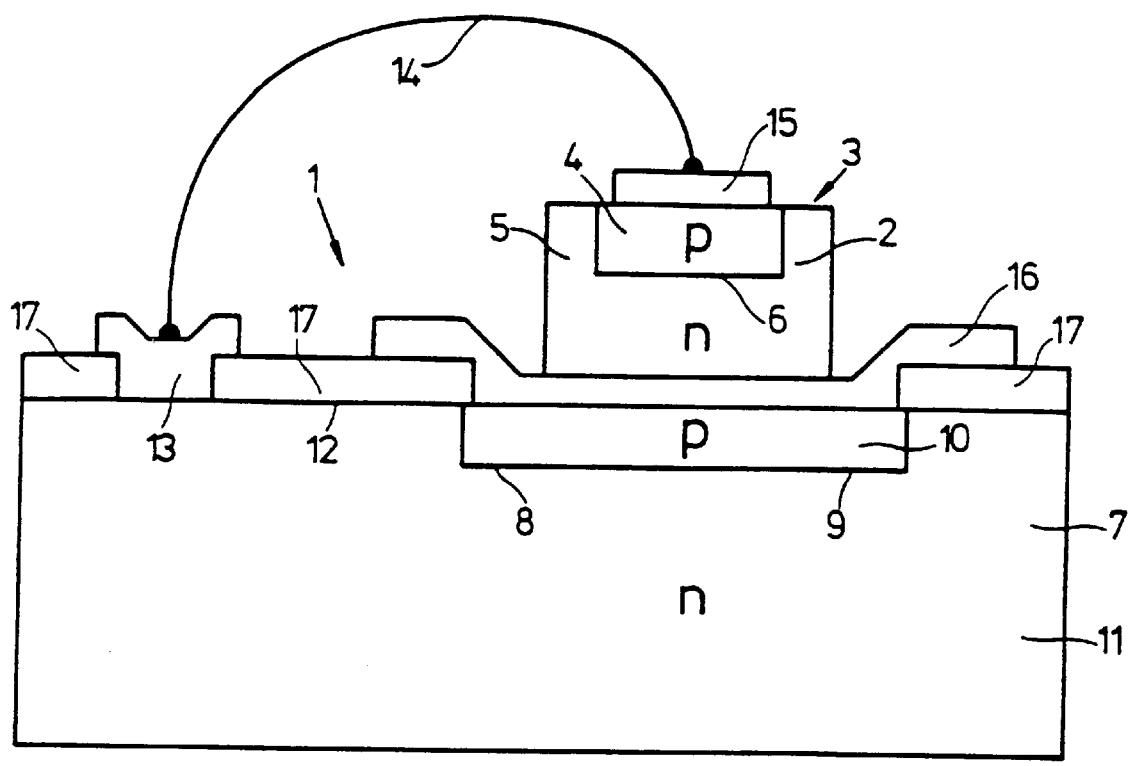

INTEGRATED SEMICONDUCTOR CIRCUIT

CROSS-REFERENCE TO RELATED APPLICATION

This is a continuation of copending International Application No. PCT/DE97/00501, filed on Mar. 13, 1997, which designated the United States.

BACKGROUND OF THE INVENTION

1. Field of the Invention

The invention relates to an integrated semiconductor circuit having a component formed of a semiconductor substrate with a first semiconductor region of a first conductivity type and a second semiconductor region of a second conductivity type forming an active pn junction therebetween. The integrated semiconductor circuit also has a protective circuit assigned to the component for serving to dissipate overvoltages and/or electrostatic charges.

Integrated semiconductor circuits, in particular fast optoelectronic transmission components such as semiconductor laser circuits or infrared light-emitting diodes are sensitive to electrostatic charges (ESD-Electrostatic Discharge) or voltage spikes in the reverse direction of the pn junction of the transmission component, which may result in damage to, or the destruction of, the component. In order to avoid ESD damage, the known integrated semiconductor circuit has protective circuits formed on the semiconductor substrate of the component and serve to dissipate overvoltages. In particular in the form of protective diodes, which are connected, for example, between a connection point of the active pn junction of the component and earth. The protective circuit is disposed in the immediate vicinity of the component that is to be protected against overvoltages, to be precise on the same semiconductor substrate as the component. The production of the protective circuit on the same substrate can lead to difficulties particularly in the case of optoelectronic transmission components having a semiconductor substrate made of a III–V compound such as, for example, gallium arsenide, indium phosphide and the like. On the one hand, the space available for forming the protective circuit on the semiconductor substrate may be restricted for layout reasons. Furthermore, optoelectronic transmission components, in particular, require, on account of the generally high transmission power, measures for ensuring good dissipation of heat during the operation of the transmission component. In an unfavorable manner, semiconductor materials made of a III–V compound have a much poorer thermal conductivity than silicon, with the result that, in many of such transmission components, a mount which is thermally coupled to the transmission component chip and is made of a material having a low thermal resistance and a large area compared with the chip area of the transmission component is employed in order to ensure good heat dissipation.

From Japanese Patent Abstract No. JP-A-59 188 181 there is disclosed an integrated semiconductor circuit in which a protective diode formed on the semiconductor mount is connected parallel to the active pn-junction. In this manner, the semiconductor mount is to function as a protective circuit for the active component after mounting a reverse voltage on the active pn-junction.

SUMMARY OF THE INVENTION

It is accordingly an object of the invention to provide an integrated semiconductor circuit which overcomes the above-mentioned disadvantages of the prior art devices of this general type, in which an active component and a protective circuit assigned to the active component serves to dissipate overvoltages. The protective circuit is integrated with the active component in such a way, that it is possible at the same time to comply with the requirements of the best possible heat dissipation produced during the operation of the active component.

With the foregoing and other objects in view there is provided, in accordance with the invention, an integrated semiconductor circuit, including: a component having a semiconductor substrate with a first semiconductor region of a first conductivity type and a second semiconductor region of a second conductivity type forming an active pn junction therebetween; a protective circuit associated with the component and serving to dissipate overvoltages and electrostatic charges, the protective circuit having a semiconductor mount with a first semiconductor mount region of the first conductivity type and a second semiconductor mount region of the second conductivity type forming a protective pn-junction therebetween; the active pn-junction of the component connected anti-parallel with the protective pn-junction of the protective circuit wherein: the second semiconductor region of the second conductivity type electrically connected to the first semiconductor mount region of the semiconductor mount; a bonding wire having a first end and a second end; a contact surface disposed on the second semiconductor mount region and connected to the first end of the bonding wire; and the first semiconductor region having an electrically conductive component bonding layer connected to the second end of the bonding wire for electrically connecting the first semiconductor region to the second semiconductor mount region.

According to the invention, it is provided that the protective circuit which is assigned to the component and serves to dissipate overvoltages and/or electrostatic charges has a protective pn junction formed on a semiconductor mount. The protective circuit has the first semiconductor mount region, disposed in the semiconductor mount, of the first conductivity type and the second semiconductor mount region of the second conductivity type. The second semiconductor mount region of the second conductivity type is electrically coupled to the first semiconductor region, formed in the semiconductor substrate, of the first conductivity type.

The invention is based on the insight of forming the protective circuit that is assigned to the active component in the form of an electrically blocking, yet highly thermally conductive pn junction on a separate semiconductor mount. By using a semiconductor mount made of a semiconductor material preferably having silicon, it is possible in a very simple manner to produce the protective circuit and integrate it in the semiconductor mount, which is at the same time provided in any case for better dissipation of heat on account of the power produced during operation of the component. Since the pn junction of the protective circuit is electrically blocking during operation of the component, no oxide or nitride insulation, which generally has a high thermal resistance, is necessary for the purpose of electrical insulation with respect to the active component.

Following the principle of the invention, it is in this case provided that the active pn junction of the component formed in the semiconductor substrate and the protective pn junction of the protective circuit formed on the semiconductor mount are reverse-connected in parallel (anti-parallel) with one another.

It may be advantageously provided that the component formed of the semiconductor substrate constitutes a semiconductor chip that is produced independently and separately, and then mounted on the semiconductor mount and is supported by the latter. It is furthermore advantageously provided that the material of the semiconductor mount has a high thermal conductivity, and that the semiconductor substrate of the component having the active pn junction is thermally coupled to the semiconductor mount. Even with relatively small-area components, it is possible to ensure favorable dissipation of the heat produced during operation of the component by the good thermal coupling to the semiconductor mount, the semiconductor mount having a correspondingly large effective area compared with the component for the purpose of heat dissipation.

In a preferred configuration of the invention, it may be provided, furthermore, that an electrically and thermally conductive, thin metal layer is provided between the semiconductor substrate of the component having the active pn junction and the semiconductor mount. The semiconductor substrate of the component may advantageously be fastened by an electrically conductive adhesive on the thin metal layer of the semiconductor mount.

In a preferred application of the invention, it is provided that the component formed of the semiconductor substrate and having the active pn junction constitutes an optoelectronic transmission component, and, during operation of the transmission component, the active pn junction is forward-biased and the protective pn junction formed in the semiconductor mount is reverse-biased. The protective pn junction of the protective circuit formed on the semiconductor mount automatically prevents a high reverse voltage across the active transmission component when both the p-type region and the n-type region of the protective diode formed on the semiconductor mount are electrically reverse-connected in parallel with the p-type and n-type regions of the active pn junction of the transmission component.

In a further configuration of the invention which is particularly simple to produce, it may be provided that the first semiconductor region of the first conductivity type is provided with an electrically conductive component contact-making layer, which is electrically connected via a bonding wire to a contact area which is disposed on the surface of the second semiconductor mount region of the second conductivity type. The configuration according to the invention advantageously makes is possible for the sensitivity of the protective circuit to overvoltages and/or electrostatic charges to be set by suitable doping of the first and second semiconductor mount regions for establishing the capacitance of the protective circuit. With a suitable selection of the substrate material for the semiconductor mount, it is consequently possible for the capacitance of the protective diode to be set as desired within wide limits. In this case, the capacitance is advantageously selected in such a way that there is no impairment of the frequency response of the active component, but at the same time the sensitivity to overvoltages and/or electrostatic charges is sufficiently high.

In accordance with an added feature of the invention, the semiconductor substrate is formed of a given material and the semiconductor mount is formed of a material different than the given material.

In accordance with another feature of the invention, the material of the semiconductor mount includes silicon, and the given material of the semiconductor substrate includes a III–V compound.

In accordance with a concomitant feature of the invention, the given material is selected from a material consisting of gallium arsenide and indium phosphide.

Other features which are considered as characteristic for the invention are set forth in the appended claims.

Although the invention is illustrated and described herein as embodied in an integrated semiconductor circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The FIGURE of the drawing is a sectional view of a semiconductor component according to the invention.

DESCRIPTION OF THE PREFERRED EMBODIMENTS

Referring now to the single FIGURE of the drawing in detail, there is shown an integrated semiconductor circuit 1 having an optoelectronic transmission component 3 which is formed of a semiconductor substrate 2 that has an active pn junction 6 which is formed between a first semiconductor region 4 of a p conductivity type and a second semiconductor region 5 of an n conductivity type. The optoelectronic transmission component 3 constitutes a separately produced semiconductor laser or infrared-emitting transmission diode chip, with e.g. gallium arsenide or indium phosphide as the base material of the semiconductor substrate 2. In order to dissipate heat produced during the operation of the transmission component 3, the latter is thermally coupled on a large-area semiconductor mount 7 made of a material having high thermal conductivity properties, in particular silicon. As protection against electrostatic charges or voltage spikes of the active transmission component 3 in the reverse direction, provision is made for a protective circuit 8, assigned to the component 3, in the form of a protective diode. The protective circuit 8 has, in a manner according to the invention, a protective pn junction 9 formed on the semiconductor mount 7 and has a first semiconductor mount region 10, disposed in the semiconductor mount 7, of the p conductivity type and a second semiconductor mount region 11 of the n conductivity type. The n-type region 11 of the protective diode 8 is electrically connected to a metallic contact area 13. The metallic contact area 13 is disposed on a surface 12 of the semiconductor mount 7 and is electrically connected via a bonding wire 14 to an electrically conductive component contact-making layer 15 on the surface of the p-type region 4. The p-type region 10 of the semiconductor mount 7 is in electrical contact with the n-type region 5 of the transmission component 3 via an electrically and thermally conductive, thin metal layer 16. In this way, the active pn junction 6 of the component 3 and the protective pn junction 9 of the protective circuit 8 formed on the semiconductor mount 7 are reverse-connected in parallel (anti-parallel) with one another. The reference numeral 17 designates thin electrically insulating layers.

During the operation of the transmission component 3, the active pn junction 6 is forward-biased and the protective pn junction 9 formed on the semiconductor mount 7 is reverse-biased. Voltage spikes in the reverse direction of the transmission component 3, for example on account of electromagnetic discharge, are thus effectively short-circuited by the then conductive protective pn junction 9 in the semiconductor mount 7. Therefore, it is possible effectively to avoid damage to, or destruction of, the component 3 on account of electrostatic charges or overvoltages. In this case, the additional capacitance of the semiconductor mount 7 formed on account of the protective pn junction 9 also affords a measure of protection against electrostatic damage in the forward direction of the active transmission component 3.

We claim:

1. An integrated semiconductor circuit, comprising:
   a component having a semiconductor substrate with a first semiconductor region of a first conductivity type and a second semiconductor region of a second conductivity type forming an active pn junction therebetween;
   a protective circuit associated with said component and serving to dissipate overvoltages and electrostatic charges, said protective circuit having a semiconductor mount with a first semiconductor mount region of the first conductivity type and a second semiconductor mount region of the second conductivity type forming a protective pn-junction therebetween;
   said active pn-junction of said component connected anti-parallel with said protective pn-junction of said protective circuit wherein:
      said second semiconductor region of the second conductivity type electrically connected to said first semiconductor mount region of said semiconductor mount;
      a bonding wire having a first end and a second end;
      a contact surface disposed on said second semiconductor mount region and connected to said first end of said bonding wire; and
      said first semiconductor region having an electrically conductive component bonding layer connected to said second end of said bonding wire for electrically connecting said first semiconductor region to said second semiconductor mount region.

2. The semiconductor circuit according to claim 1, wherein said component is a semiconductor chip produced independently and separately and then mounted on and supported by said semiconductor mount.

3. The semiconductor circuit according to claim 1, wherein said semiconductor mount is formed of a material having high thermal conductivity properties, and said semiconductor substrate of said component is thermally coupled to said semiconductor mount.

4. The semiconductor circuit according to claim 3, including an electrically and thermally conductive, thin metal layer disposed between said semiconductor substrate and said semiconductor mount.

5. The semiconductor circuit according to claim 1, wherein said semiconductor substrate is formed of a given material and said semiconductor mount is formed of a material different than said given material.

6. The semiconductor circuit according to claim 5, wherein said material of said semiconductor mount includes silicon, and said given material of said semiconductor substrate includes a III–V compound.

7. The semiconductor circuit according to claim 6, wherein said given material is selected from a material consisting of gallium arsenide and indium phosphide.

8. The semiconductor circuit according to claim 1, wherein said component is an optoelectronic transmission component, and during operation of said optoelectronic transmission component said active pn junction is forward-biased and said protective pn junction formed on said semiconductor mount is reverse-biased.

9. The semiconductor circuit according to claim 1, wherein a sensitivity of said protective circuit to overvoltages and electrostatic charges is set by suitable doping of said first semiconductor mount region and said second semiconductor mount region for determining a capacitance of said protective circuit.

* * * * *